United States Patent
Hsu et al.

(10) Patent No.: US 6,385,273 B1
(45) Date of Patent: May 7, 2002

(54) DEVICE FOR TESTING CLOCK PULSE GENERATING CIRCUIT

(75) Inventors: Ming-Hsun Hsu, Taipei; Chu-Yu Hsiao, Taichung; Ying-Lang Chuang, Kaohsiung, all of (TW)

(73) Assignee: Via Technologies, Inc., Taipei Hsien (TW)

( * ) Notice: Subject to any disclaimer, the term of this patent is extended or adjusted under 35 U.S.C. 154(b) by 11 days.

(21) Appl. No.: 09/711,841

(22) Filed: Nov. 13, 2000

(30) Foreign Application Priority Data

Jan. 31, 2000 (TW) .......................................... 089101615

(51) Int. Cl.[7] .......................................... G01R 31/317
(52) U.S. Cl. ........................ 377/19; 324/158.1; 327/144
(58) Field of Search .......................... 377/19; 327/141, 327/144, 145; 324/763, 765, 158.1; 714/724, 740, 741, 718

(56) References Cited

U.S. PATENT DOCUMENTS 6,172,544 B1 * 1/2001 Sugamori ................... 327/263
6,219,305 B1 * 4/2001 Patrie et al. ................. 368/113

* cited by examiner

Primary Examiner—Tuan T. Lam
(74) Attorney, Agent, or Firm—J.C. Patents

(57) ABSTRACT

A testing device for checking a clock signal generated by a clock pulse generating circuit. The clock pulse generating circuit outputs a clock signal and a multiplied clock second signal. The testing device includes a reset circuit, a dividing unit and a mask circuit. The reset circuit receives a first reset signal and the clock signal and then generates a second reset signal synchronous with the clock signal. The second reset signal controls the dividing unit and the mask circuit. Inside the dividing unit, the multiplied clock signal is divided by an integral multiple to produce a divided clock signal. The divided clock signal is then passed to the mask circuit where uncertain portions of the third signal are blanketed to produce a masked clock signal. The masked clock signal is sent to a tester where cycle width of the masked clock signal is measured and first reset signal is sent to the reset circuit.

6 Claims, 2 Drawing Sheets

DEVICE FOR TESTING CLOCK PULSE GENERATING CIRCUIT

CROSS-REFERENCE TO RELATED APPLICATION

This application claims the priority benefit of Taiwan application serial no. 89101615, filed Jan. 31, 2000.

BACKGROUND OF THE INVENTION

1. Field of Invention

The present invention relates to a device for testing signals. More particularly, the present invention relates to a device for testing a clock pulse generating circuit.

2. Description of Related Art

In a digital system, operations are often carried out by referring to a clock signal. Without a normal clock pulse generator, synchronization with other sections of the circuit is impossible. Since clock signals are of such importance to a digital circuit, clock signal generating circuit is often the first component to be tested. In general, clock pulse generator is tested using a counter. The counter is capable of computing the frequency of clock pulse signal to detect any abnormality.

Due to rapid progress in semiconductor technologies, many digital circuits are integrated with a clock pulse generator on a silicon chip. Furthermore, by the addition of a phase lock loop in the clock pulse generator, any signal frequency can be obtained from a single quartz oscillator. However, testing the clock pulse generating circuit inside a highly integrated silicon chip is difficult. Nowadays, system having a clocking frequency in excess of 100 MHz is quite common. As the operating speed of a digital system continues to increase due to the development of advance techniques, a counter capable of testing high frequency clock pulses is needed to check the performance of the system.

To test the clock pulse generating circuit of a digital system, a special counter is conventionally required, and the test cost is high. This type of testing is unsuitable for highly integrated silicon chip. Moreover, as operating speed of the system is increased, frequency response of the counter has to be increased. Hence, testing equipment has to be upgraded resulting in a higher production cost.

SUMMARY OF THE INVENTION

Accordingly, one object of the present invention is to provide a testing device that permits an external tester to check the clock pulse generating circuit in a digital system.

A second object of this invention is to provide a testing device capable of checking the signals from a clock pulse generator together with a simple external tester. Since additional counter is not needed, production cost is lowered.

To achieve these and other advantages and in accordance with the purpose of the invention, as embodied and broadly described herein, the invention provides a testing device for checking a clock pulse generating circuit. The clock pulse generating circuit includes an oscillator and an analog phase lock loop (APLL) circuit. The oscillator outputs a first signal to the APLL circuit. The APLL circuit multiplies the frequency of the clock signal by a preset value to produce a multiplied clock signal. The testing device includes a reset circuit, a dividing unit and a mask circuit.

A first reset signal and the clock signal are sent to the reset circuit, and then a second reset signal that also synchronizes with the first signal is generated by the reset circuit. The dividing unit and the mask circuit are controlled by the second reset signal. When the second reset signal is activated, the dividing unit and the mask circuit are reset.

The multiplied clock signal is picked up by the dividing unit and then the multiplied clock signal is divided by an integral multiple to produce a divided clock signal. The divided clock signal is output to the mask circuit. The initial and end of the active section of the divided clock signal is masked by the mask circuit to produce a masked clock signal.

According to one preferred embodiment of this invention, the masked clock signal is transferred to a tester. Cycle width of the masked clock signal is computed inside the tester, and the first reset signal is produced by the tester.

The reset circuit includes a first flip-flop and a second flip-flop. The first flip-flop and the second flip-flop both have a data input terminal, a clock pulse input terminal and a state output terminal. The clock pulse input terminal of the first and the second flip-flop receives the clock signal. The data input terminal of the first flip-flop receives the first reset signal. The data input terminal of the second flip-flop is connected to state output terminal of the first flip-flop. The state output terminal of the second flip-flop outputs the second reset signal.

The dividing unit includes a plurality of flip-flops. Each flip-flop has a data input terminal, a clock pulse input terminal, a state output terminal and a complementary state output terminal. The complementary state output terminal is coupled to the data input terminal for each flip-flop. The flip-flops are serially connected. The state output terminal of the previous flip-flop is coupled to the clock pulse input terminal of following flip-flop. The clock pulse input terminal of the first flip-flop receives the multiplied clock signal while the state output terminal of the last flip-flop outputs the divided clock signal.

Furthermore, each one of the flip-flops inside the dividing unit has a reset input terminal. Each reset input terminal is controlled by the second reset signal. When the second reset signal activates, each flip-flop inside the dividing unit is reset.

According to this invention, the mask circuit blankets an initial portion within the active section of the divided clock signal. The masked initial portion has a length equal to two cycle periods of the first signal. In addition, the mask circuit also blankets an end portion of the active section of the divided clock signal. The masked end portion also has a length equal to two cycle periods of the first signal.

To achieve these and other advantages and in accordance with the purpose of the invention, as embodied and broadly described herein, the invention provides a testing method. The testing method is designed for testing a clock pulse generating circuit which outputs a clock signal and a multiplied clock signal. The testing method comprises the steps of (1) generating a second reset signal in synchrony with the clock signal by receiving a first reset signal; (2) dividing the multiplied clock signal to produce a divided clock signal, wherein the divided clock signal is reset when the second reset signal is activated; (3) masking uncertain portions of the divided clock signal to produce a masked clock signal, wherein the masked clock signal is reset when the second reset signal is activated; and (4) determining the correctness of the clock signal according to the masked clock signal.

According to one preferred embodiment of this invention, the cycle width of the masked clock signal is computed after the first reset signal is issued, in order to determine the correctness of the clock signal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
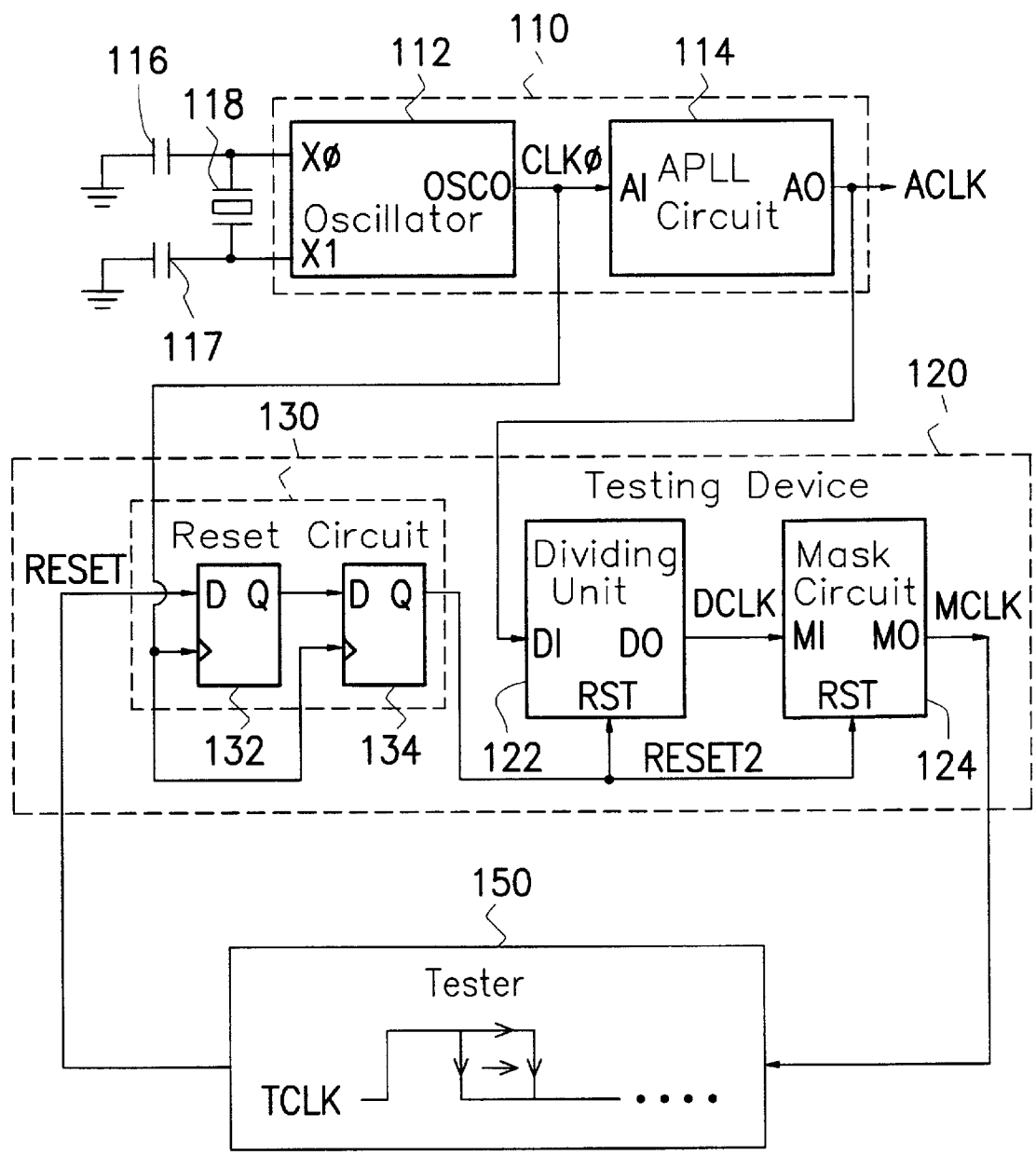
FIG. 1 is a block diagram showing a testing device and associated circuit elements for testing a clock pulse generating circuit according to this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram showing a testing device and associated circuit elements for checking a clock pulse generating circuit according to one preferred embodiment of this invention. As shown in FIG. 1, the clock pulse generating circuit 110 is a circuit waiting to be tested. The testing device 120 is a circuit that works in tandem with a tester 150 for checking the functions of the clock pulse generating circuit 110. The clock pulse generating circuit 110 and the testing device 120 may be integrated together on the same silicon chip such as the chipset in a personal computer. When all production steps are completed, the tester 150 and the testing device 120 is wired up again so that functional performance of the clock pulse circuit 110 can be checked.

The clock pulse generating circuit 110 comprises an oscillator 112 and an analog phase lock loop (APLL) circuit 114. The oscillator 112 starts to oscillate and sends out a clock signal CLK0 from the output terminal OSCO as soon as the oscillator 112 is hooked up to a quartz oscillating crystal 118 and capacitors 116 and 117 respectively. Frequency of the clock signal CLK0 depends on the selected quartz crystal 118. The clock signal CLK0 is sent to the input terminal AI of the APLL circuit 114. According to preset ratio and an input reference signal, an output signal of the desired frequency is generated. After frequency multiplication inside the APLL circuit 114, a multiplied clock signal ACLK is output from the output terminal AO.

The testing device 120 comprises a reset circuit 130, a dividing unit 122 and a mask circuit 124. The reset circuit 130 includes two flip-flops 132 and 134. Function of the reset circuit 130 is to pick up a reset signal RESET from the tester 150 and output another reset signal RESET2 synchronous to the clock signal CLK0. The second reset signal RESET2 from the reset circuit 130 is capable of resetting the dividing unit 122 and the mask unit 124. The multiplied clock signal ACLK from the APLL circuit 114 is sent to the input terminal DI of the dividing unit 122 for frequency dividing. The output signal of the dividing unit 122 is a divided clock signal DCLK. The divided clock signal DCLK is output from the output terminal DO to the input terminal MI of the mask circuit 124. Inside the mask circuit 124, uncertain portion of the signal is masked. For example, the initial and the end portion of the active section of the divided clock signal DCLK is masked inside the mask circuit 124. The masked clock signal MCLK is then output from the output terminal M0. The masked clock signal MCLK is sent to the tester 150 for computing cycles of the masked clock signal MCLK. A signal TCLK is a reference clock signal used inside the tester 150 for computing width of activation of the masked clock signal MCLK. According to the computed cycle, frequency of the multiplied clock signal ACLK at the output terminal of the APLL circuit 114 is deduced. Hence, any abnormality of output frequency can be detected.

Figure 2:
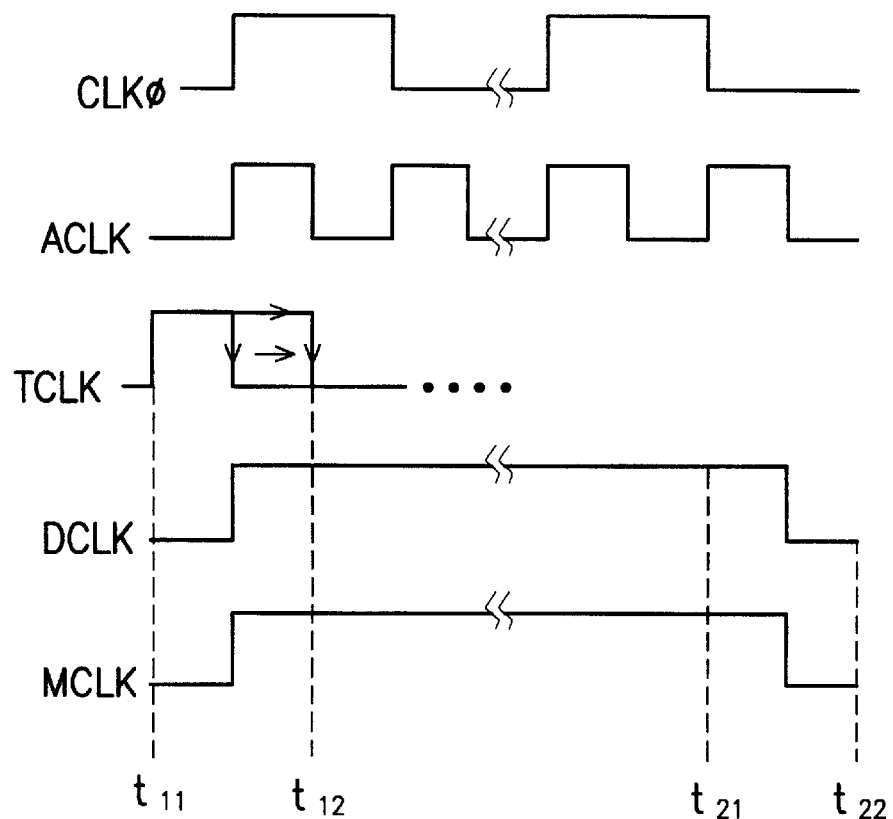
FIG. 2 is a timing diagram showing various waveforms tapped from the testing device shown in FIG. 1 during testing.

FIG. 2 is a timing diagram showing various waveforms tapped from the testing device shown in FIG. 1 during testing. As shown in FIG. 2, the clock signal CLK0 is the output waveform at the output terminal OSCO of the oscillator 112. The multiplied clock signal ACLK is the output waveform after frequency multiplication inside the APLL circuit 114. Assume that frequency multiplication ratio performed by the APLL circuit 114 is two, the multiplied clock signal ACLK from the APLL circuit 114 will have a frequency twice that of the clock signal CLK0 from the oscillator 112. The divided clock signal DCLK is obtained after frequency dividing of the multiplied clock signal ACLK, and the masked clock signal MCLK is obtained after passing the divided clock signal DCLK through the mask circuit 124.

During circuit design phase, multiplication operation inside the APLL circuit 114 and division operation inside the dividing unit 122 can be set. Hence, during testing, the tester 150 is able to measure the action length of the masked clock signal MCLK. For example, by computing total width of the masked clock signal MCLK at high potential, the frequency of the multiplied clock signal ACLK can be obtained. To initiate a testing, the tester 150 outputs a reset signal RESET. The reset signal RESET from the tester 150 is not synchronized with the output signal from the oscillator 112 of the clock pulse generating circuit 110. When the flip-flops 132 and 134 inside the reset circuit 130 are triggered by the reset signal RESET, another reset signal RESET2 synchronous to the clock signal CLK0 is generated. The second reset signal RESET2 from the reset circuit 130 is sent out for resetting the dividing unit 122 and the mask circuit 124. The mask circuit 124 masks away uncertain portions of the divided clock signal DCLK. Output signal MCLK is sent to the tester 150 for checking correctness of output frequency from the APLL circuit 114. Since the reference clock signal TCLK used by the tester 150 is not synchronized with the clock signal CLK0, the rising edge or falling edge of the reference clock signal TCLK can appear anywhere. If the tester 150 counts with reference to the falling edge of the reference clock signal TCLK, potential level of the divided clock signal DCLK can be regarded as high or low by the tester 150 when falling edge of the reference clock signal TCLK coincides with rising edge of the divided clock signal DCLK. If the tester 150 regards the potential level as high, the count value is added by 1. Similarly, when falling edge of the reference clock signal TCLK coincides with falling edge of the divided clock signal DCLK, the divided clock signal DCLK can be regarded as high or low by the tester 150. If the tester 150 regards the potential level as high, the count value is added by 1.

To prevent inaccuracy, the mask circuit 124 masks the uncertain portion of the signals such as from t11 to t12 and from t21 to t22. Time period for masking can be a cycle of the multiplied clock signal ACLK or the clock signal CLK0. For example, in each of the rising edge and the falling edge of the divided clock signal DCLK, two cycles are blanked.

Non-synchronicity between the reference clock signal TCLK and the clock signal CLK0 can lead to counting errors when cycles of the divided clock signal DCLK are computed by the tester 150. In practice, however, the quartz oscillating crystal is a high Q-value component. Hence, when the oscillator 112 is hooked onto a quartz oscillating crystal, frequency of the clock signal CLK0 is mainly determined by the quartz oscillating crystal 118. Varying the capacitance of the capacitors 116 and 117 can tune the frequency of the clock signal CLK0 up or down by a small amount. On the other hand, when the APLL circuit 114 is locked up, frequency of its output signal is very stable. Even if the lock-up frequency is in error, the erroneous frequency and the desired frequency have integral multiple relationship. Consequently, as long as the count value obtained by measuring the divided clock signal DCLK is within the tolerable error range, the operation of the APLL circuit 114 and the oscillator 112 is working properly, and hence the frequency of the multiplied clock signal ACLK is correct.

Figure 3:
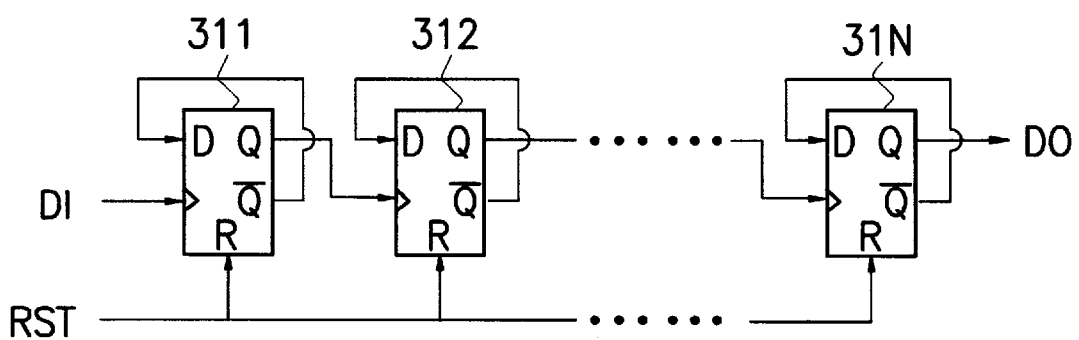
FIG. 3 is a block diagram showing the internal structure of the dividing unit shown in FIG. 1.

FIG. 3 is a block diagram showing the internal structure of the dividing unit shown in FIG. 1. As shown in FIG. 3, the dividing unit comprises N serially linked D-type flip-flops 311, 312, . . . , 31N. Each flip-flop is used as a toggle flip-flop. Hence, each flip-flop functions as a two-divider of frequency. After passing through Nflip-flops, frequency of input signal is divided by $2^N$. In other words, frequency of signal at the output terminal is only $\frac{1}{2}^N$ that of the frequency at the input terminal.

The testing device of this invention is capable of removing uncertain portions of the output signal of the APLL circuit from the clock pulse generator. The selectively removed signal is re-directed to an external tester where cycle width is determined so that the frequency of the output signal from the APLL circuit can be computed. In addition, through a reset circuit, the reset signal provided by the external tester is converted into an internal synchronous signal. Furthermore, a mask circuit is used to mask the uncertain portion of the selectively removed signal so that the effect of uncertainty is minimized.

Since the operation of a digital circuit is synchronized by a clock signal, the first test after integrated circuit fabrication is probably the measurement of the clock frequency of a clock pulse generator. If abnormal clock pulses are generated, there is no need to perform other testing operations. Although a digital system such as a personal computer has an operating frequency more than 100 MHz, by applying the invention, the testing device with the integrated circuit has pre-designed unit for lowering the frequency before going to an external tester. Hence, testing is not limited by the design of the tester.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing device for testing a clock pulse generating circuit outputting a clock signal and a multiplied clock signal, comprising:

a reset circuit for receiving a first reset signal and the clock signal and generating a second reset signal in synchrony with the clock signal;

a dividing unit for receiving the multiplied clock signal and the second reset signal, wherein a divided clock signal is output from the dividing unit, and the dividing unit is reset when the second reset signal is activated; and a mask circuit for receiving the divided clock signal and the second reset signal, wherein the mask circuit masks uncertain portions of the divided clock signal to output a masked clock signal, and the mask circuit is reset when the second reset signal is activated.

2. The testing device of claim 1, wherein the reset circuit further includes:

a first flip-flop and a second flip-flop, each flip-flop has a data input terminal, a clock input terminal and a state output terminal, the clock input terminals of the first flip-flop and the second flip-flop connected to the clock signal, the data input terminal of the first flip-flop connected to the first reset signal, the data input terminal of the second flip-flop connected to the state output terminal of the first flop-flop, and the state output terminal of the second flip-flop outputting the second reset signal.

3. The testing device of claim 1, wherein the dividing unit includes:

a plurality of flip-flops, each flip-flop having a data input terminal, a clock input terminal, a state output terminal, a reset input terminal and a complementary state output terminal, the complementary state output terminal and the data input terminal of each flip-flop connected mutually;

each flip-flop serially connected, such that the state output terminal of a previous flip-flop connected to the clock input terminal of a following flip-flop, and the clock input terminal of one flip-flop receiving the multiplied clock signal while the state output terminal of another flip-flop outputs the divided clock signal, the reset input terminal receiving the second reset signal such that all the flip-flops are reset when the second reset signal is activated.

4. The testing device of claim 1, wherein the masked clock signal is transmitted to a tester where cycle width of the masked clock signal is computed after the first reset signal is issued.

5. A testing method for testing a clock signal and a multiplied clock signal related to the clock signal, the testing method comprising the steps of:

generating a second reset signal in synchrony with the clock signal according to a first reset signal and the clock signal;

dividing the multiplied clock signal to produce a divided clock signal, wherein the divided clock signal is reset when the second reset signal is activated;

masking uncertain portions of the divided clock signal to produce a masked clock signal, wherein the masked clock signal is reset when the second reset signal is activated; and determining the correctness of the clock signal according to the masked clock signal.

6. The testing method of claim 5, wherein cycle width of the masked clock signal is computed after the first reset signal is issued, in order to determine the correctness of the clock signal.

* * * * *